United States Patent [19]
Polykarpov et al.

[11] Patent Number: 6,080,520
[45] Date of Patent: Jun. 27, 2000

[54] IMAGING SYSTEM HAVING OPAQUE SUPPORT

[75] Inventors: Alexander Y. Polykarpov, Mason; Joseph C. Camillus, Centerville, both of Ohio

[73] Assignee: Cycolor, Inc., Miamisburg, Ohio

[21] Appl. No.: 09/320,098

[22] Filed: May 26, 1999

[51] Int. Cl.[7] .................................................. G03F 7/038
[52] U.S. Cl. .......................... 430/138; 430/523; 430/950
[58] Field of Search .................................... 430/138, 523, 430/950

[56] References Cited

U.S. PATENT DOCUMENTS

| | | | |
|---|---|---|---|
| 3,672,935 | 6/1972 | Miller et al. | 117/36.8 |
| 3,732,120 | 5/1973 | Brockett et al. | 117/16 |
| 4,440,846 | 4/1984 | Sanders et al. | 430/138 |
| 4,772,541 | 9/1988 | Gottschalk et al. | 430/339 |
| 4,912,011 | 3/1990 | Yamamoto et al. | 430/138 |
| 4,962,010 | 10/1990 | Colyer et al. | 430/138 |
| 5,030,538 | 7/1991 | Tobias et al. | 430/138 |
| 5,091,280 | 2/1992 | Yamaguchi et al. | 130/138 |
| 5,118,590 | 6/1992 | Kakimi | 430/138 |
| 5,550,627 | 8/1996 | Dowler et al. | 355/326 |
| 5,783,353 | 7/1998 | Camillus et al. | 430/138 |

FOREIGN PATENT DOCUMENTS 9534845   12/1995   WIPO.

*Primary Examiner*—Hoa Van Le
*Attorney, Agent, or Firm*—Thompson Hine & Flory LLP

[57] ABSTRACT

A photosensitive imaging system comprising a photosensitive material and a developer material, the photosensitive material including a support having a layer of photosensitive microcapsules on the surface thereof, said photosensitive microcapsules including an internal phase containing a photosensitive composition and a color precursor wherein, upon image-wise exposing said photosensitive material and rupturing said microcapsules, said color precursor image-wise reacts with said developer material to form a color image, said support being a high opacity laminate of a black or brown film laminated between a pair of white pigmented films; in one embodiment the black or brown film is a magnetic recording layer.

14 Claims, 3 Drawing Sheets

IMAGING SYSTEM HAVING OPAQUE SUPPORT

BACKGROUND OF THE INVENTION

The present invention relates to an improvement in photosensitive imaging systems of the type taught in U.S. Pat. Nos. 4,399,209 and 4,440,846, wherein a highly opaque backing is used in the photosensitive material.

Imaging systems employing microencapsulated radiation sensitive compositions are the subject of commonly assigned U.S. Pat. Nos. 4,399,209; 4,416,966; 4,440,846; 4,766,050 and 5,783,353. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and a color former is encapsulated with the photopolymerizable composition. Exposure to actinic radiation hardens the internal phase of the microcapsules. Following exposure, the imaging sheet is developed by subjecting it to a uniform rupturing force in the presence of a developer. An image transfer system in which the developer material is coated on a separate substrate as a separate developer or copy sheet is disclosed in commonly assigned U.S. Pat. No. 4,399,209. A self-contained imaging system in which the encapsulated color former and the developer material are present in one layer or in two interactive layers is disclosed in commonly assigned U.S. Pat. No. 4,440,846.

When imaging systems and particularly self-contained imaging systems of the type described in U.S. Pat. Nos. 4,440,846 and 5,783,353 are exposed and developed in a small format printer, it is often desirable to expose the imaging sheets while they are situated in a stack. To do this it is important that the exposure radiation is not transmitted through the top imaging sheet in the stack to the underlying sheets, otherwise the underlying sheets may be damaged. Additionally, there are certain applications in which it may be desirable to write or print on the back of an image. It is important that this printing not show through the support and detract from the quality of the image.

SUMMARY OF THE INVENTION

In accordance with the present invention a photosensitive material is provided which, in its simplest form, includes a layer of photosensitive microcapsules and a support wherein the support is a laminate of a first film containing a white pigment, a second film containing a black pigment, and a third film containing a white pigment.

In a more particular embodiment of the invention, the photosensitive material is a self-contained photosensitive material which includes a layer of photosensitive microcapsules, a developer in the same or a separate layer as said microcapsules and an opaque support having the laminar construction described above.

In another embodiment of the invention, a digital printer media which enables one to form images on both sides of a single sheet of the media is provided. This imaging material comprises a pair of transparent supports (e.g., PET) which are positioned on the outside of either a layer of a mixture of photosensitive microcapsules and developer or individual layers of microcapsules and developer. In the middle of the imaging material is the opaque structure.

DETAILED DESCRIPTION OF THE INVENTION

Figure 1:
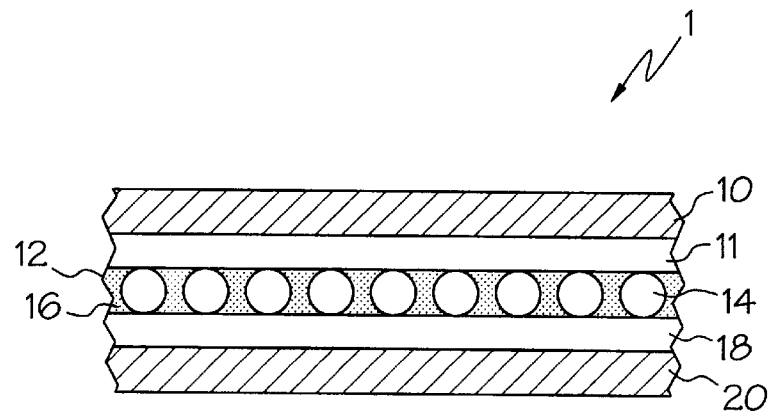

U.S. Pat. Nos. 4,399,209, 4,440,846 and 5,783,353 are incorporated herein by reference to the extent not inconsistent with the teachings herein.

The improved imaging system of the invention may be embodied in a self-contained copy sheet in which the photosensitive microcapsules and the developer material are co-deposited in one layer or in two interactive layers as described in U.S. Pat. No. 5,783,353; or they may be embodied in a transfer system as described in U.S. Pat. No. 4,399,209 in which the photosensitive microcapsules and the developer material are coated on separate substrate; which are assembled after the microcapsules have been exposed to form a latent image. The imaging system of the invention may also be embodied in a two sided self-contained system in which the microcapsules and the developer are provided in one or in individual layers as just described on opposite sides at an opaque support. Each system operates by photographic control of the access between the chromogenic material and the developer as previously described. In the self-contained imaging system, following capsule rupture, the chromogenic material and the developer are able to react to form a visible image in the unexposed areas. Gradual development of the visible image is observed following exposure and capsule rupture as the chromogenic material exudes from the microcapsules, migrates to the developer and mixes and reacts. In the most typical embodiment, capsule rupture is effected by the application of pressure to the imaging sheet alone (in the case of a self-contained system) or in contact with a developer sheet (in a transfer system) using pressure rollers or a roller ball. To record images the imaging material can be scanned with an LED print head and developed by application of pressure to the unit. The media can be imaged using a printer which incorporates an LED/developer head of the type described in U.S. Pat. No. 5,550,627.

In accordance with the invention, the photosensitive material is constructed using a highly opaque support which permits the material to be exposed in a stack or to be printed upon the back side without detracting from the image. This support is a laminate of an opaque black film between two opaque pigmented white films. This support is commercially available under the tradename Melinex 6295 from DuPont. The support is typically about 4 mils thick and about one-third of the thickness is attributable to each of the individual films. The white pigment is typically barium sulphate, but those skilled in the art will recognize that other white pigments could be used. The dark pigment is carbon black. However, in another embodiment of the invention, an iron oxide and/or chromium oxide of the type used in conventional magnetic recording films is used as the dark pigment in the interlaminar film. In this manner, information can be magnetically recorded within the film thereby enabling the photosensitive material to be used in certain information-based and/or security-based applications. For example, the photosensitive material can be an employee identification badge in which the employee's picture is provided within the badge and information regarding the employee is magnetically recorded within the film or certain codes can be recorded within the film to permit the employee access to the place of employment or restricted areas within the place of employment by swiping the photosensitive material incorporating the film across an appropriate reader.

A photosensitive material in accordance with one embodiment of the invention is illustrated in more detail in FIG. 1. A self-contained imaging system 1 comprises in order: a first transparent support 10, a subbing layer 11, an imaging composition 12 comprising photohardenable microcapsules 14 and a developer material 16, a layer of adhesive 18, and the opaque support 20. Imaging layer 12 typically contains about 20 to 80% (dry weight) of the developer, about 80 to 20% (dry weight) microcapsules and 0 to 20% of a binder. The layer is typically applied in a dry coat weight of about 8 to 20 g/cm². An example of such a coating formulation is illustrated in Example 1 below.

Figure 1A:
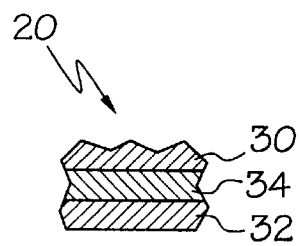
Figure 2:
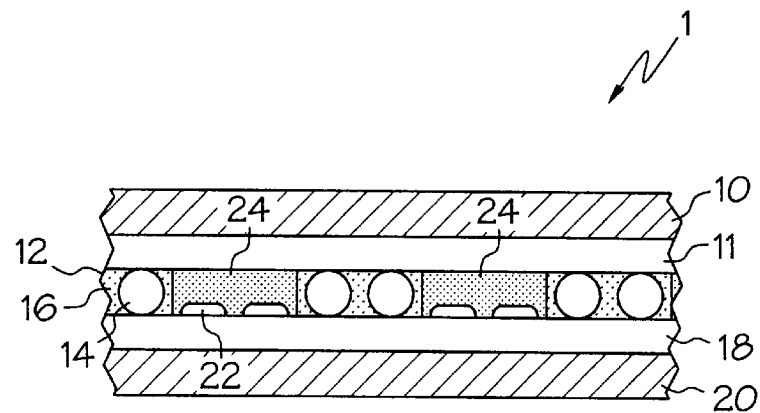

Images are formed in the present invention in the same manner as described in U.S. Pat. No. 4,440,846. By imagewise exposing this unit to actinic radiation, the microcapsules are differentially hardened in the exposed areas. The exposed unit is subjected to pressure to rupture the microcapsules. FIG. 2 illustrates the self-contained imaging system of FIG. 1 after exposure and rupture of the microcapsules 14. Ruptured microcapsules 22 release a color forming agent, whereupon the developer material 16 reacts with the color forming agent to form an image 24. The image formed is viewed through the transparent support 10 against the support 20. The support 20 is a three layer structure which is made up of two outer white pigmented films 30, 32 of a white pigment such as barium sulphate and an internal black or brown pigmented film or coating 34 as illustrated in FIG. 1a. The films can be coextruded PET films or the white film can be coated with a pigmented layer (e.g., a magnetic recording layer) and heat-sealed with the other white film to form the laminate. The transparent support(s) through which the image is viewed can be formed from any transparent polymeric film. A film will be selected which provides good photographic quality when viewing the image. Preferably, a film will be used which is resistant to yellowing and contains a UV absorber. The preferred substrate is polyethylene terephthalate (PET) which is a clear polymeric material. Typically, the PET has a thickness of about 1 to 4 mils.

Figure 3:
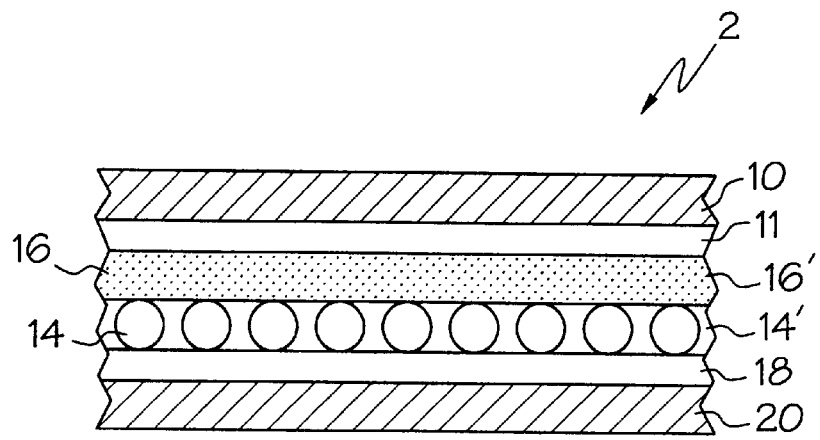
Figure 4:
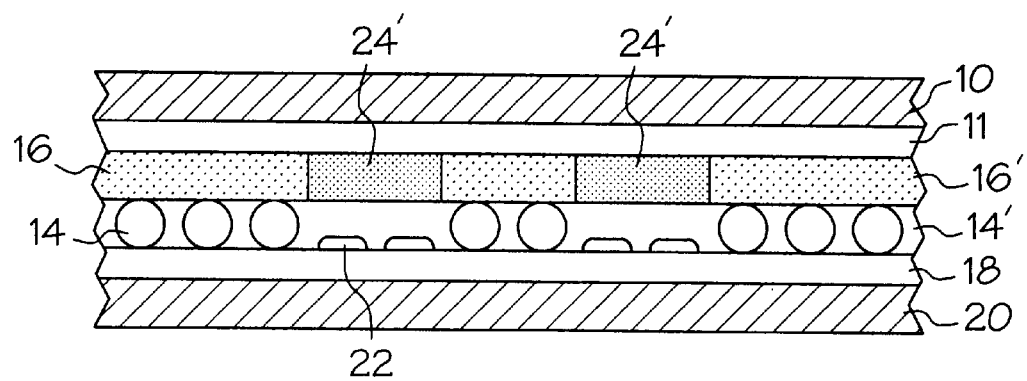

FIGS. 3 and 4 illustrate a further embodiment in which the developer is provided in a layer 16' and the microcapsules are provided in a layer 14' instead of a single layer as in FIGS. 1 and 2. As explained below, this assembly can be prepared by coating support 10 in order with subbing layer 11, developer layer 16' and microcapsule layer 14' and securing this subassembly to the opaque film 20 by means of a pressure-sensitive adhesive 18. When this unit is exposed and the capsules are ruptured, the image 24' is formed in layer 16'.

Figure 5:
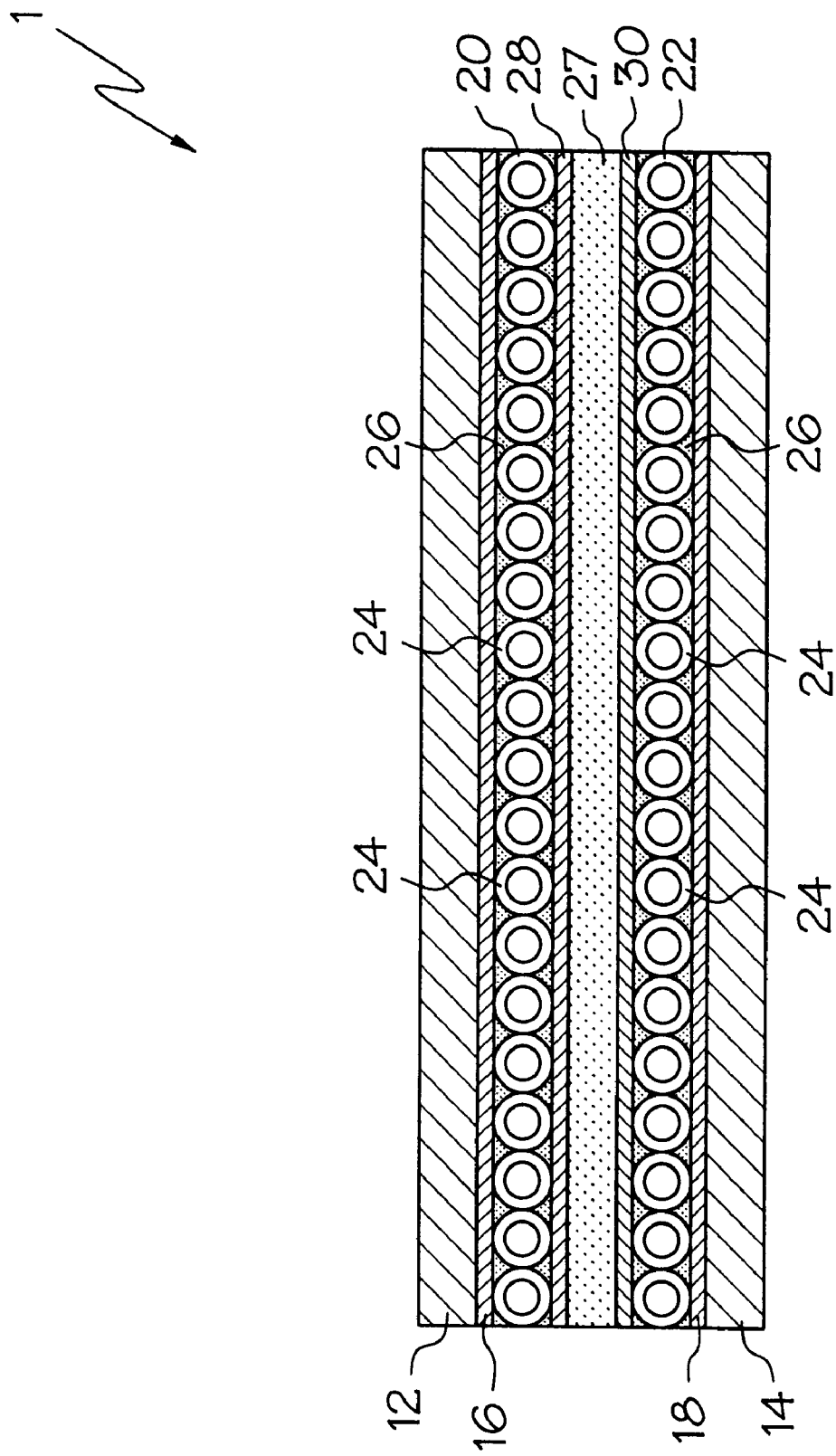

FIG. 5 illustrates a further embodiment of a photosensitive material in accordance with the invention. The photosensitive material is generally indicated by the numeral 11 and includes first and second transparent films 12 and 14 which are respectively provided with subbing layers 16 and 18 and mixed layers 20 and 22 of photosensitive microcapsules 24 and developer material 26. These films are secured to an opaque support 27. The microcapsule carrying films are secured to the opaque film 27 by a pair of adhesive layers 28 and 30. To manufacture the unit, the microcapsules and developer, mixed or in separate layers, may be coated on the clear PET. The coated film may then be laminated with the opaque film which has been coated on one or both faces with an adhesive. A subbing layer is preferably provided on the clear PET film to tightly bond the film together so that the film cannot be separated without destruction of the unit. Of course, other manufacturing processes could also be used. In manufacturing a two-sided unit to an adhesive backed unit, the opaque film will be coated on both faces with an adhesive. The adhesive backed unit will be covered with a release liner on one side. The two-sided unit will be mated with the microcapsule coated film.

The operational center of the imaging system of the present invention is the encapsulate or internal phase of the microcapsules. In accordance with the invention, the internal phase comprises a photosensitive composition and a chromogenic material. Typically, the photosensitive composition includes a photoinitiator and a substance which undergoes a change in viscosity upon exposure to light in the presence of the photoinitiator. That substance is most typically a monomer, dimer, or oligomer which is polymerized to a higher molecular weight compound or it may be a polymer which is cross-linked. If a negative-working imaging material is desired, it may be a compound which is depolymerized or otherwise decomposed upon exposure.

Typically, the photosensitive composition is a free radical addition polymerizable or crosslinkable composition. The most typical examples of a free radical addition polymerizable or crosslinkable composition useful in the present invention contains an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate. Other radiation curable substances as well as radiation de-polymerizable materials are described in U.S. Pat. No. 4,399,209.

The chromogenic materials used in the present invention include those chromogenic materials conventionally used in carbonless paper. In general, these materials are colorless electron donating dye precursor compounds which react with a developer compound to generate a dye. Representative examples of such dye precursors include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl) phthalide, 3-(p-dimethylaminophenyl)-3-(1, 2dimethylindole-3-yl)phthalide, 3-(p-dimethylaminophenyl)-3-(2-methylindole-3-yl)phthalide,3-(p-dimethylaminophenyl)-3-(2-phenylindole-3-yl) phthalide, 3,3-bis(1,2-dimethylindole-3-yl)-5-dimethylaminophthalide, 3,3-bis-(1,2-dimethylindole-3-yl) 6-dimethylaminophthalide, 3,3-bis-(9-ethylcarbazole-3-yl)-5-dimethylaminophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-

(diethylamino)fluoran, 3-methyl-spiro-dinaphthopyran, 3,3'-dichloro-spiro-dinaphthopyran, 3-benzyl-spiro-dinaphthopyran, 3-methyl-naphtho-(3-methoxybenzo)-spiropyran, 3-propyl-spirodibenzoidipyran, etc. Mixtures of these dye precursors can be used if desired. Also useful in the present invention are the fluoran color formers disclosed in U.S. Pat. No. 3,920,510, which is incorporated by reference.

In accordance with the invention, the chromogenic material is incorporated in the internal phase in an amount sufficient to produce a visible image of the desired density upon reaction with the developer. In general, these amounts range from approximately 0.5 to about 20.0 percent based on the weight of the internal phase solution (e.g., monomer, oil and other additives) containing the chromogen. A preferred range is from about 2 percent to about 8 percent. The amount of the chromogenic material required to obtain suitable images depends on the nature of the chromogen, the nature of the internal phase, and the type of imaging system. Less chromogenic material may be used in the internal phase of a self-contained imaging system in which the developer material is co-deposited on a common substrate with the microcapsules. To prevent undesired coloration in a self-contained sheet one may incorporate color suppressants with the chromogenic material.

In addition to the chromogenic material and the photosensitive material, the internal phase of microcapsules may also include a carrier oil to affect and control the tonal quality of the images obtained. Tonal quality (half-tone gradation) is an important factor in faithfully reproducing pictorial images. Initial studies show that where trimethylol propane triacrylate is used in the radiation curable material, 20% of a carrier oil such as brominated paraffin can improve tonal qualities. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the chromogenic material in the photosensitive composition before exposure, the nature of the chromogenic material and the viscosity of the characteristics of the internal phase. When present, examples of carrier oils are alkylated biphenyls (e.g., monoisopropylbiphenyl), polychlorinated biphenyls, caster oil, mineral oil, deodorized kerosense, naphthenic mineral oils, dibutyl phthalate, dibutyl fumerate, brominated paraffin and mixtures thereof. Alkylated biphenyls are generally less toxic and preferred.

Various photoinitiators can be selected for use in the present invention. These compounds absorb the exposure radiation and generate a free radical alone or in conjunction with a sensitizer. Conventionally, there are homolytic photoinitiators which cleave to form two radicals and initiators which radiation converts to an active species which generates a radical by abstracting a hydrogen from a hydrogen donor. There are also initiators which complex with a sensitizer to produce a free radical generating species and initiators which otherwise generate radicals in the presence of a sensitizer. Both types can be used. Where ultraviolet sensitivity is desired, as in the case of direct transmission imaging using ultraviolet light, suitable photoinitiators include α-alkoxy phenyl ketones, O-acylated-α-oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones; photoreducible dye-reducing agent redox couples, halogenated paraffins (e.g., brominated or chlorinated paraffin) and benzoin alkyl ethers. Specific photoinitiators useful in the present invention include: α-alkoxyketone, α,α-dialkoxyketone, benzophenone, xanthane, chloroxanthanone, chloromethylxanthanone, chlorosulfoxylxanthanone, thioxanthanone, chloroxanthanone, chloromethylthioxanthanone, chlorosulforyl thioxanthanone, chloromethylnaphthalene, chlorosulfonyl naphthalene, chloromethyl anthracene, chlorosulfonyl anthracene, chloromethyl benzoxazole, chloromethyl benzothiazole, chloromethyl benzimidazole, chlorosulfonyl benzoxazole, chlorosulfonyl benzothiazole, chlorosulfonyl benzimidazole, a chloromethyl quinoline, a chlorosulfonyl quinoline, a chloromethyl benzophenone, a chlorosulfonyl benzophenone, a chloromethyl fluorenone, a chlorosulfony fluorenone, carbon tetrabromide, benzoin methyl ether, benzoin ethyl ether, desyl chloride, desyl amine, methylene blue/ascorbic acid, chlorinated aliphatic hydrocarbons and combinations thereof. The sensitivity among these compounds can be shifted by adding substituents such that the compounds generate radicals when exposed to the desired radiation wavelength.

Particularly useful as photoinitators in the present invention are cationic dye-borate anion complexes as disclosed in commonly assigned U.S. Pat. Nos. 5,112,752; 5,100,755; 5,057,393; 4,865,942; 4,842,980; 4,800,149; 4,772,530 and 4,772,541 which are incorporated herein by reference. When employed as a photoinitiator in the present invention, the cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5 % by weight. While the cationic dye-borate anion complex can be used alone as the initiator, it is preferable to use the complex in combination with an autoxidizer. An autoxidizer is a compound which is capable of consuming oxygen in a free radical chain process. Examples of useful autoxidizers are N,N-dialkylanilines.

Examples of N,N-dialkylanilines are dialkylanilines substituted in one or more of the ortho-, meta-, or para- position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N, N-dimethylaniline, 4-acetyl-N,N-dimethylaniline, 4-bromo-N,N-dimethylaniline, ethyl 4-(N, N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N, N-dimethylaniline, 4-ethoxy-N,N-dimethylaniline, N,N-dimethylaniline, N,N-dimethylthioanicidine, 4-amino- N,N-dimethylaniline, 3-hydroxy-N,N-dimethylaniline, N,N,N', N'-tetramethyl-1,4-dianiline, 4-acetamido-N, N-dimethylaniline, 2,6-diisopropyl-N,N-dimethylaniline, 2,6-diethyl-N,N-dimethylaniline, N,N,2,4,6- pentamethylaniline (PMA) and p-t-butyl-N,N-dimethylaniline.

In accordance with one embodiment of the invention, the photohardenable compositions used in the microcapsules contain a dye borate photoinitiator and a disulfide coinitiator. Examples of useful disulfides are described in U.S. Pat. No. 5,230,982.

In accordance with one embodiment of the invention, a full color imaging system is provided in which the microcapsules are in three sets respectively containing cyan, magenta and yellow color formers respectively sensitive to red, green, and blue light respectively. For good color balance, the visible-sensitive microcapsules are sensitive (λmax) at about 450 nm, 540 nm, and 650 nm, respectively. Such a system is useful with visible light sources in direct transmission or reflection imaging. Such a material is useful in making contact prints, projected prints of color photographic slides, or in digital printing. They are also useful in electronic imaging using lasers or pencil light sources of appropriate wavelengths. Because digital imaging systems do not require the use of visible light, sensitivity can be extended into the UV and IR. Accordingly, the sensitivity can be extended into the IR and/or UV to spread the absorption spectra of the photoinitiators and avoid crosstalk.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Patent No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

When the microcapsules and developer are mixed and used in one layer or coated wet in contiguous layers to form a self-contained system, the developer material is preferably one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall or both. The microcapsules may become completely disrupted with a complete breakdown or disintegration of the wall. The problem is believed to be caused by the presence of water soluble acid salts in the developer solution. By modifying the acidic salts to make them water insoluble the developer material can be made compatible with the MF microcapsules. A preferred developer, which has good stability is Schenectady International phenolic resin HRJ-4250 solution.

Microencapsulation has been accomplished by a variety of known techniques including coacervation, interfacial polymerization, polymerization of one or more monomers in an oil, as well as various melting, dispersing and cooling methods. In one embodiment of the invention, the internal phase is encapsulated in a urea-formaldehyde wall-former and, more particularly, a urea-resorcinol-formaldehyde wall former in which resorcinol has been added to the wall former to enhance its oleophilicity. Other hydrophilic wall-forming materials which may also be useful in the present invention include gelatin (see U.S. Pat. No. 2,730,456 and 2,800,457 to Green et al) gum arabic, polyvinyl alcohol, carboxymethyl cellulose; resorcinol-formaldehyde (see U.S. Pat. No. 3,755,190 to Hart et al), isocyanate (see U.S. Pat. No. 3,914,511 to Vassiliades), polyurethane (see U.S. Pat. No. 3,796,669 to Kiritani et al), melamine-formaldehyde resin and hydroxypropyl cellulose, ureaformaldehyde wall-formers and more particularly urea-resorcinol-formaldehyde wall formers (in which oleophilicity is enhanced by the addition of resorcinol) (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Melamine-formaldehyde capsules are particularly useful. It is desirable in the present invention to provide a pre-wall in the preparation of the microcapsules. See U.S. Pat. No. 4,962,010 for a particularly preferred encapsulation using pectin and sulfonated polystyrene as system modifiers. The formation of pre-walls is known, however, the use of larger amounts of the polyisocyanate precursor is desired. A capsule size should be selected which minimizes light attenuation.

The mean size of the capsules used in the present invention may vary over a broad range but generally ranges from approximately 1 to 25 microns. As a general rule, image resolution improves as the capsule size decreases with the caveat that if the capsule size is too small, the capsule may sit within incongruities in the support and the support may screen the capsules from exposure. Very small capsules may also fail to rupture upon the application of pressure. In view of the foregoing, it has been found that a preferred mean capsule size range is approximately 1 to 15 microns and particularly approximately 1 to 10 microns.

In a preferred embodiment of the invention, the imaging system is a sealed self-contained imaging system. The term "sealed" as used herein refers to a seal which is designed as a nontemporary seal which results in destruction of the imaging assembly if the seal is broken. This sealed format is advantageous because it prevents the developer material and the chemicals in the microcapsules from contacting persons during handling and, depending on the nature of the supports, it also may prevent oxygen from permeating into the photohardenable material which may improve film speed and the stability of the image.

In order to insure that the imaging system is effectively sealed between the supports, a subbing layer is provided between one of the supports and the imaging layer and an adhesive is provided between the other support and the imaging layer. For optical clarity, the subbing layer will typically be located between the transparent support and the imaging layer. (The term "imaging layer" refers to the mixed layer of microcapsules and developer or to the combination of the microcapsule layer and the developer layer). However, which support receives the subbing layer and which support receives the adhesive is a function of which support is coated with the wet imaging layer composition and which is assembled with the coated and dried imaging layer. The support which is coated with the imaging layer composition (which is typically the transparent support) will be provided with the subbing layer and the opaque support will receive the adhesive. In accordance with the preferred embodiment of the invention, the subbing layer is formed from a compound having chemical moieties such as hydroxy groups which will react with and bind to the microcapsules such as partially hydrolyzed polyesters and sulfonated polyesters of aromatic acids and aliphatic or cycloaliphatic alcohols and salts thereof such as the AQ polymers available from Eastman Chemical, e.g., AQ38 and AQ55. Useful polymers also include polyethylene oxide and, more particularly, AQUAZOL. The subbing layer may be applied in a coat weight of about 1 to 4 g/cm$^2$ (dry weight). Although preferred, when the developer layer is coated on the transparent films the subbing layers 16 and 18 are not always necessary.

One technique which is useful to improve media stability resides in conditioning the developer and microcapsule layer at a relative humidity of about 45 tp 80% and preferably, about 60%. Most preferably, the layer is conditioned at about 60% R.H., for about 2 to 12 hours or more at ambient temperatures. This has a beneficial effect on image retention and photospeed.

Adhesive materials useful assembling imaging units in the present invention can be selected from the general class of "modified acrylics" which have good adhesion, and which may be formulated for improved tack by addition of tackifying resins or other chemical additives. A useful adhesive must be designed for high initial adhesion and for adhesion to plastic substrates like polyester. It must have the ability to flow quickly for laminating to porous material (the imaging layer) and yet have inertness to the imaging layer. Preferably, the adhesive is transparent or translucent and most preferably it is a transparent adhesive which remains clear even after subjecting the assembly to radiation and pressure necessary to image-wise expose and rupture the microcapsules. High strength adhesives useful in this invention are the film label stock adhesives of the 3M Company; preferred are 3M's #300 and #310 adhesive formulas which have shown good "inertness" to the imaging layer and stability, and are useful when applied in the amount of about 10 to 30 g/m$^2$. Other examples of adhesives useful in this invention may be aqueous-based adhesives such as Aerosett 2177 or Aerosett 2550 both of which are commercially available from Ashland Chemical Co., PD 0681, AP 6903, and W 3320 available from H. B. Fuller, or solvent-based adhesives such as PS 508 sold by Ashland Chemical Co. The adhesives may be used separately or in combination. The amount of the adhesive will vary depending on the nature of the adhesive and the support.

When the microcapsules and developer are coated in separate layers on separate supports spacers or anti-blocking agents can be used to improve media stability and thereby extend the shelf life of the imaging system. If the microcapsule layer and the developer layer remain in close proximity to each other after development, continued reaction between the image-forming material from the ruptured microcapsules and the developer material can cause the image to darken in some cases. Where this is a problem, spacers may be used. Typically, useful spacers are particles having high crush resistance such as mineral particles such as calcium carbonate, glass microspheres, ceramic particles, and the like. Examples of such materials include 560/10,000 glass microspheres from 3M which have a crush resistance of 10,000 psi, a particle size of about 35 microns and include about 90% "floaters" (low density particles); zeeospheres from Zeeosphere Industries, e.g., Zeeosphere Grade 200 having a mean particle size of about 5 microns and Zeeosphere 600 having a mean particle size of about 10 microns; and calcium carbonate having a particle site of about 1 micron. These spacers may be incorporated in the developer layer or in the microcapsule layer. The spacers are typically used in an amount of about 1 to 10% based on the microcapsules.

In some cases it may also be desirable to coat the developer layer with an antiblocking agent. Antiblocking agents are polymeric materials which are coated on the developer layer to prevent the developer layer from sticking to the microcapsule layer but which do not deny the color precursor access to the color developer to form an image with good density. Representative examples of useful antiblocking agents include elastomeric materials such as Neoprene emulsion from DuPont; Lytron GA-5705, a polystyrene emulsion from Morton International; and Hycar, a nitrile emulsion from B. F. Goodrich.

When the microcapsule layer and the developer layer are not contiguously bonded to each other as when the developer is coated on one support and the microcapsules on a separate support, the peripheral edges of the self-contained assembly can be bonded using any of the conventional means used to seal polymeric materials such as polyethylene terephthalate. For example, films can be sealed using an adhesive or they may be heat sealed together or they can be sealed by any other technique. Preferably, the PET is sealed using a heat sealing method such as a heat knife. While the seal is described as being at the periphery, it will be appreciated that the seal could be inset from the periphery, e.g., by the distance of a border, provided that the seal is interposed between the imaging chemicals and the users.

The invention is illustrated in more detail by the following non-limiting example.

EXAMPLE 1

Model Laboratory Capsule Preparation

1. Into a stainless steel beaker, 110 g water and 4.5 g dry sodium salt of polyvinylbenzenesulfonic acid (VERSA) are weighed.

2. The beaker is clamped in place on a hot plate under an overhead mixer. A six-bladed, 45° pitch, turbine impeller is used on the mixer.

3. After thoroughly mixing, 4.0 g pectin (polygalacturonic acid methyl ester) is slowly sifted into the beaker. This mixture is stirred for 2 hours at room temperature (800–1200 rpm).

4. The pH is adjusted to 6.0 with 2% sodium hydroxide.

5. The mixer is turned up to 3000 rpm and the internal phase is added over a period of 10–15 seconds. Emulsification is continued for 10 minutes. Magenta and yellow precursor phases are emulsified at 25°–30° C. Cyan phase is emulsified at 45°–50° C. (oil), 25°–30° C. (water).

6. At the start of emulsification, the hot plate is turned up so heating continues during emulsification.

7. After 20 minutes, the mixing speed is reduced to 2000 rpm, and a solution of melamine-formaldehyde prepolymer is slowly added. This prepolymer is prepared by adding 6.5 g formaldehyde solution (37%) to a dispersion of 3.9 g melamine in 44 g water. After stirring at room temperature for 1 hour the pH is adjusted to 8.5 with 5 % sodium carbonate and then heated to 62° C. until the solution becomes clear (30 minutes).

8. The pH is adjusted to 6.0, using 5% phosphoric acid. The beaker is then covered with foil and placed in a water bath to bring the temperature of the preparation to 75° C. When 75° C. is reached, the hot plate is adjusted to maintain this temperature for a two hour cure time during which the capsule walls are formed.

9. After curing, mixing speed is reduced to 1800 rpm, formaldehyde scavenger solution (7.7 g urea and 7.0 g water) is added and the solution cured another 40 minutes.

10. After 40 minutes hold time, turn down the mixer rpm to 1100 and adjust the pH to 9.5 using a 20% NaOH solution and then allow to stir at 500 rpm overnight at room temperature.

Three batches of microcapsules are prepared as above for use in a full color imaging sheet using the three internal phase compositions set forth below.

| Yellow Capsule Internal Phase (420 nm) | |
|---|---|
| TMPTA | 163.6 g |
| Photoinitiator | 0.80 g |
| Bis-2,2' benzothiazole disulfide | 0.55 g |
| 2,6-Diisopropyldimethylaniline (DIDMA) | 0.82 g |
| CP 269 (Yellow dye precursor from Hilton Davis) | 16.0 g |
| Desmodur N-100 (Bayer Biuret Polyisocyanate Resins) | 13.09 g |

| Magenta Capsule Internal Phase (550 nm) | |
|---|---|
| TMPTA | 147.3 g |
| DPHPA | 16.3 g |
| Photoinitiator | 0.47 g |
| Bis-2,2' benzothiazole disulfide | 0.55 g |
| 2,6-Diisopropyldimethylaniline | 1.09 g |
| CP164 (Magenta color precursor from Hilton-Davis Chemical Co.) | 25.3 g |
| Desmodur N-100 (Bayer Biuret Polyisocyanate Resins) | 13.09 g |

| Cyan Capsule Internal Phase (650 nm) | |
|---|---|
| TMPTA | 114.50 g |
| DPHPA | 49.10 g |
| Photoinitiator | 0.85 g |
| Bis-$2,2^7$ benzothiazole disulfide | 0.55 g |
| 2,6-Diisopropyldimethylaniline | 1.09 g |
| CP 270 (Cyan Precursor from Yamada Chemical Co. Jpn.) | 6 g |

Microcapsules prepared as above can be mixed in the following dry ratio as percentage to prepare the following coating composition:

| Cyan Capsules | 38% |
|---|---|
| Magenta Capsules | 32% |
| Yellow Capsules | 30% |

A typical coating composition can be coated on an opaque PET support (Melinex) at a dry coat weight of 17 g/sq m. Such composition comprises:

| Cyliths | 4.94 g (29%) |
|---|---|
| Phenolic Resin (HRJ 4542 from Schenectady Chemical Co.) | 11.54 g (68%) |
| Polyvinyl alcohol (airvol grade 205 from Air Products Co.) | 0.26 g (1.5%) |
| Sequrez 755 (binder) | 0.26 g (1.5%) |

To prepare a film unit, a film coated with developer can be assembled with a support coated with microcapsules in a facing relationship and the edges of the two supports can be sealed using Ashland's PS 508 adhesive.

EXAMPLE 2

The following coating composition can be prepared and coated on a PET support:

| Cyan Capsules (Ex. 1) | 36 g |
|---|---|
| Magenta Capsules (Ex. 1) | 30 g |
| Yellow Capsules (Ex. 1) | 34 g |
| Dow Binder (Ex. 1) | 10 g |
| HRJ 4542 Developer (Schenectady Chemical Co.) | 90 g |
| PVA (airvol grade 205 from Air Products Co.) | 10 g |

To prepare a film unit in accordance with the invention, a sheet coated as above can be assembled with a Melinex 6295 film coated with Ashland's PS 508 adhesive and sealed to form a film unit.

Having described the invention in detail and by reference to preferred embodiments thereof, it will be apparent that modifications and variations are possible without departing from the scope of the invention as defined in the following claims.

What is claimed is:

1. A photosensitive material comprising an opaque support having a layer of photosensitive microcapsules thereon, said photosensitive microcapsules including an internal phase containing a photosensitive composition and a color precursor wherein, upon image-wise exposing said photosensitive material to actinic radiation and rupturing said microcapsules in the presence of a developer material, said color precursor image-wise reacts with said developer material to form a color image, the improvement wherein said support is a high opacity laminate of a black film laminated between a pair of white pigmented films.

2. The photosensitive material of claim 1 is in a self-contained imaging system.

3. The photosensitive material of claim 2 wherein said self-contained imaging system is a sealed, self-contained imaging systems additionally comprising a transparent support, said photosensitive microcapsules and said developer being interposed between said supports.

4. The photosensitive material of claim 3 wherein said sealed, self-contained imaging system further includes an adhesive.

5. The photosensitive material of claim 3 wherein said sealed, self-contained imaging system further includes a subbing layer between said transparent support and said opaque support.

6. The photosensitive material of claim 1 wherein said transparent support is a clear polyethylene terephthalate film.

7. A sealed, self-contained photosensitive material comprising a transparent support, an opaque support, a layer of photosensitive microcapsules containing an internal phase which includes a photosensitive composition and a color precursor interposed between said supports, a developer material present in said layer of photosensitive microcapsules or in a separate layer interposed between said supports wherein upon image-wise exposing said layer of photosensitive microcapsules to actinic radiation and rupturing said microcapsules, the color precursor is released from said microcapsules and reacts with said developer material to form a color image, the improvement wherein said opaque support is a high opacity laminate of a black or brown film laminated between two white pigmented films.

8. The photosensitive material of claim 1 wherein said black or brown film is a black film incorporating carbon black.

9. The photosensitive material of claim 1 wherein said black or brown film incorporates a magnetic recording pigment such that said photosensitive material can be used to magnetically record information.

10. The photosensitive material of claim 7 wherein said sealed, self-contained imaging system further includes an adhesive.

11. The photosensitive material of claim 7 wherein said sealed, self-contained imaging system further includes a subbing layer between said transparent support and said opaque support.

12. The photosensitive material of claim 7 wherein said transparent support is a clear polyethylene terephthalate film.

13. The photosensitive material of claim 7 wherein said black or brown film is a film incorporating carbon black.

14. The photosensitive material of claim 7 wherein said black or brown film incorporates a magnetic recording pigment such that said photosensitive material can be used to magnetically record information.

* * * * *